US012672359B2

(12) United States Patent     (10) Patent No.: US 12,672,359 B2
Shin et al.     (45) Date of Patent: Jun. 30, 2026

(54) THIN FILM-TYPE SOLAR CELL

(71) Applicant: JUSUNG ENGINEERING CO., LTD., Gwangju-si (KR)

(72) Inventors: Hyun Kyo Shin, Gwangju-si (KR); Duck Ho Kim, Gwangju-si (KR); Yong Hyun Kim, Gwangju-si (KR); Chang Su Mha, Gwangju-si (KR); Kyung In Min, Gwangju-si (KR); Chang Kyun Park, Gwangju-si (KR); Jung Kyun Lee, Gwangju-si (KR); Chul Joo Hwang, Gwangju-si (KR)

(73) Assignee: JUSUNG ENGINEERING CO., LTD. (KR)

( * ) Notice: Subject to any disclaimer, the term of this patent is extended or adjusted under 35 U.S.C. 154(b) by 42 days.

(21) Appl. No.: 18/225,076

(22) Filed: Jul. 21, 2023

(65) Prior Publication Data

US 2023/0361230 A1     Nov. 9, 2023

Related U.S. Application Data

(62) Division of application No. 16/612,369, filed as application No. PCT/KR2018/007831 on Jul. 11, 2018, now abandoned.

(30) Foreign Application Priority Data

Jul. 11, 2017     (KR) ........................ 10-2017-0087563

(51) Int. Cl.
    H10F 19/37     (2025.01)
    H10F 19/35     (2025.01)
(52) U.S. Cl.
    CPC ............. H10F 19/37 (2025.01); H10F 19/35 (2025.01)

(58) Field of Classification Search
    CPC . H01L 31/0468; H01L 31/0465; H10F 19/37; H10F 19/35; H10F 19/30; H10F 77/413; H10F 77/42
See application file for complete search history.

(56) References Cited

U.S. PATENT DOCUMENTS

2002/0026955 A1    3/2002   Ouchida et al.
2010/0167458 A1*   7/2010   Shin ................ H01L 31/022425
                                        438/73
(Continued)

FOREIGN PATENT DOCUMENTS

CN       102144301 A    8/2011
CN       102227817 A    10/2011
(Continued)

OTHER PUBLICATIONS

Extended European Search Report for Application No. 18832075.8, mailed Mar. 1, 2021.

*Primary Examiner* — Uyen M Tran
(74) *Attorney, Agent, or Firm* — Renaissance IP Law Group LLP

(57)           ABSTRACT

The present inventive concept relates to a thin film type solar cell including a plurality of unit cells serially connected to one another on a substrate; and a light transmission part provided in the plurality of unit cells, wherein the light transmission part is provided in a discontinuous rectilinear structure including at least one disconnection part.

According to the present inventive concept, since the light transmission part is discontinuously formed, the repetition characteristic of the light transmission part including a plurality of dot patterns may be reduced, thereby effectively solving a problem where a wave pattern such as a moire phenomenon occurs when light is passing through the light transmission part.

8 Claims, 4 Drawing Sheets

(56) References Cited

U.S. PATENT DOCUMENTS

| | | | |
|---|---|---|---|
| 2010/0294348 | A1 | 11/2010 | Li et al. |
| 2011/0017280 | A1 | 1/2011 | Rumsby |
| 2013/0137210 | A1 | 5/2013 | Cheng |

FOREIGN PATENT DOCUMENTS

| | | | |
|---|---|---|---|
| JP | 2002299666 | A | 10/2002 |
| JP | 2002343998 | A | 11/2002 |
| JP | 2005530069 | A | 10/2005 |
| JP | 2010272871 | A | 12/2010 |
| JP | 2011243850 | A | 12/2011 |
| JP | 2013098287 | A | 5/2013 |
| JP | 2014078767 | A | 5/2014 |
| JP | 2014154713 | A | 8/2014 |
| JP | 2015207607 | A | 11/2015 |
| JP | 2017503346 | A | 1/2017 |
| KR | 20070101647 | A | 10/2007 |
| KR | 20110017280 | A | 2/2011 |
| KR | 20110113387 | A | 10/2011 |
| KR | 20160002052 | A | 1/2016 |
| WO | 2013002394 | A1 | 1/2013 |
| WO | 2015119380 | A1 | 8/2015 |

* cited by examiner

THIN FILM-TYPE SOLAR CELL

TECHNICAL FIELD

The present disclosure relates to a thin film type solar cell, and more particularly, to a thin film type solar cell having a see-through structure.

BACKGROUND ART

Solar cells are devices that convert light energy into electrical energy, based on a characteristic of a semiconductor.

The solar cells have a PN junction structure where a positive (P)-type semiconductor and a negative (N)-type semiconductor are joined to each other. When sunlight is incident on a solar cell having the PN junction structure, a hole and an electron are generated in the semiconductors by energy of the incident sunlight. At this time, due to an electric field which is generated in a PN junction, the hole (+) moves to the P-type semiconductor, and the electron (−) moves to the N-type semiconductor, thereby generating an electric potential to produce power.

The solar cells may be categorized into thin film type solar cells and wafer type solar cells.

The thin film type solar cells are solar cells which are manufactured by forming a semiconductor on a substrate such as glass in a thin film type, and the wafer type solar cells are solar cells which are manufactured by using a silicon wafer as a substrate.

The wafer type solar cells are better in efficiency than the thin film type solar cells, but have a limitation in minimizing a thickness in terms of a process and use an expensive semiconductor substrate, causing an increase in the manufacturing cost.

Since it is possible to secure a see-through light transmission area in the thin film type solar cells, the thin film type solar cells may be easily applied to windows of buildings, sunroofs of vehicles, or the like.

Hereinafter, a related art see-through thin film type solar cell will be described with reference to the drawings.

FIG. 1A is a schematic plan view of a related art see-through thin film type solar cell, and FIG. 1B is a cross-sectional view taken along line A-B of FIG. 1A.

As seen in FIG. 1A, a plurality of unit cells U1 to U4 including a first unit cell U1, a second unit cell U2, a third unit cell U3, and a fourth unit cell U4 are provided on a substrate 10.

The plurality of unit cells U1 to U4 are serially connected to one another by a first separation part P1, a contact part P2, and a second separation part P3. The first separation part P1 and the second separation part P3 separate a front electrode and a rear electrode between adjacent unit cells U1 to U4, and the contact part P2 connects the adjacent unit cells U1 to U4 in series. The first separation part P1, the contact part P2, and the second separation part P3 of one set are arranged in the same direction (for example, a lengthwise direction) between the adjacent unit cells U1 to U4.

A plurality of light transmission parts T are arranged in a direction (for example, a widthwise direction) intersecting with the first separation part P1, the contact part P2, and the second separation part P3. Light may pass through the light transmission part T, and thus, the thin film type solar cell has a see-through type.

As seen in FIG. 1B, a plurality of front electrodes 20 are provided on the substrate 10, a plurality of semiconductor layers 30 are provided on the plurality of front electrodes 20, and a plurality of rear electrodes 40 are provided on the plurality of semiconductor layers 30.

The plurality of front electrodes 20 are respectively provided in the unit cells U1 to U3 with the first separation part P1 therebetween.

The plurality of semiconductor layers 30 are respectively provided in the unit cells U1 to U3 with the contact part P2 and the second separation part P3 therebetween.

The plurality of rear electrodes 40 are respectively provided in the unit cells U1 to U3 with the second separation part P3 therebetween.

The rear electrode 40 of one unit cell U1 or U2 is connected to the front electrode 20 of the unit cell U2 or U3 adjacent thereto through the contact part P2, between adjacent unit cells U1 to U3, and thus, the plurality of unit cells U1 to U3 are connected to one another in series.

The light transmission part T is provided in each of the unit cells U1 to U3. For reference, only a case where the light transmission part T is provided in the second unit cell U2 is illustrated in FIG. 1B.

The light transmission part T is formed by removing a certain area of each of the semiconductor layer 30 and the rear electrode 40, and thus, light may pass through the light transmission part T. The substrate 10 and the front electrode 20 are also formed in the light transmission part T area, but since the substrate 10 and the front electrode 20 are formed of a transparent material, light may pass through the light transmission part T area.

In the related art thin film type sola cell, a wave pattern such as a moire phenomenon is formed in the light transmission part T area, and due to this, an object is shown like being distorted.

The light transmission part T is formed by removing a certain area of each of the semiconductor layer 30 and the rear electrode 40 through a laser process generally, and thus, a fine dot pattern is continuously provided in the light transmission part T. In this case, when light passes through the light transmission part T including the fine dot pattern, lights passing through the dot pattern cause wavelength collision therebetween, and thus, a wave pattern such as the moire phenomenon is formed. Due to this, an object seen through the light transmission part T is distorted, causing a reduction in visibility of the thin film type solar cell.

DISCLOSURE

Technical Problem

The present inventive concept is devised to solve the above-described problems of the related art, and an object of the present inventive concept is to provide a thin film type solar cell which solves a problem where a wave pattern such as a moire phenomenon is formed in a light transmission part area, thereby enhancing visibility.

Technical Solution

To accomplish the above-described object, the present inventive concept provides a thin film type solar cell including: a plurality of unit cells serially connected to one another on a substrate; and a light transmission part provided in the plurality of unit cells, wherein the light transmission part is provided in a discontinuous rectilinear structure including at least one disconnection part.

The light transmission part may be provided in a plurality of continuous areas which are apart from one another with the at least one disconnection part therebetween, and a plurality of dot patterns may overlap one another in the plurality of continuous areas.

The at least one disconnection part may include a first disconnection part and a second disconnection part, and the plurality of continuous areas may include a first continuous area and a second continuous area, which are apart from one another with the first disconnection part therebetween, and a third continuous area which is apart from the second continuous area with the second disconnection part therebetween.

A length of the first disconnection part may differ from a length of the second disconnection part.

Number of the plurality of dot patterns may differ in at least two continuous areas among the first continuous area, the second continuous area, and the third continuous area.

The light transmission part may include a first light transmission part and a second light transmission part which are apart from each other in a certain direction, and a pattern of the first light transmission part may differ from a pattern of the second light transmission part.

Each of the first light transmission part and the second light transmission part may be provided in a plurality of continuous areas which are apart from one another with the disconnection part therebetween, and the disconnection part of the first light transmission part may be provided not to overlap the disconnection part of the second light transmission part.

Each of the first light transmission part and the second light transmission part may be provided in a plurality of continuous areas which are apart from one another with the disconnection part therebetween, and a length of the disconnection part of the first light transmission part may differ from a length of the disconnection part of the second light transmission part.

Each of the first light transmission part and the second light transmission part may be provided in a plurality of continuous areas which are apart from one another with the disconnection part therebetween, and number of the plurality of dot patterns provided in a continuous area of the first light transmission part may differ from number of the plurality of dot patterns provided in a continuous area of the second light transmission part.

Moreover, the present inventive concept provides a thin film type solar cell including: a plurality of separation parts arranged in a first direction on a substrate to separate a plurality of unit cells; and a plurality of light transmission parts arranged in a second direction to intersect with the plurality of separation parts, the plurality of light transmission parts defining an active area along with the plurality of separation parts, wherein a disconnection part of each of the plurality of light transmission parts is provided at a boundary of the active area.

The plurality of light transmission parts may include a first light transmission part and a second light transmission part which are apart from each other, and the disconnection part may include a first disconnection part of the first light transmission part and a second disconnection part of the second light transmission part.

A pattern of the first light transmission part may differ from a pattern of the second light transmission part.

The first disconnection part and the second disconnection part may be provided not to overlap each other.

The active area may include a first active area and a second active area, and the disconnection part provided in the first active area and the disconnection part provided in the second active area may be provided asymmetrically.

A first electrode, a semiconductor layer, and a second electrode may be provided on the substrate, and the light transmission part may be provided in a structure where a certain area of each of the semiconductor layer and the second electrode is removed.

Advantageous Effect

According to the present inventive concept, the following effects are obtained.

According to an embodiment of the present inventive concept, since a light transmission part is discontinuously formed, the repetition characteristic of the light transmission part including a plurality of dot patterns may be reduced, thereby effectively solving a problem where a wave pattern such as a moire phenomenon occurs when light is passing through the light transmission part.

According to another embodiment of the present inventive concept, since a length of a first disconnection part is set to be different from that of a second disconnection part, the repetition characteristic of the light transmission part including the plurality of dot patterns may be more reduced, thereby effectively solving a problem where a wave pattern such as the moire phenomenon occurs when light is passing through the light transmission part.

According to another embodiment of the present inventive concept, since the number of laser spots LS or the number of dot patterns is set differently in at least two continuous areas of a plurality of continuous areas including the light transmission part, the repetition characteristic of the light transmission part including the plurality of dot patterns may be more reduced, thereby effectively solving a problem where a wave pattern such as the moire phenomenon occurs when light is passing through the light transmission part.

According to another embodiment of the present inventive concept, since a disconnection part of a first light transmission part is provided not to overlap a disconnection part of a second light transmission part, the repetition characteristic of the light transmission part including the plurality of dot patterns may be more reduced, thereby effectively solving a problem where a wave pattern such as the moire phenomenon occurs when light is passing through the light transmission part.

MODE FOR INVENTION

Figure 1A:
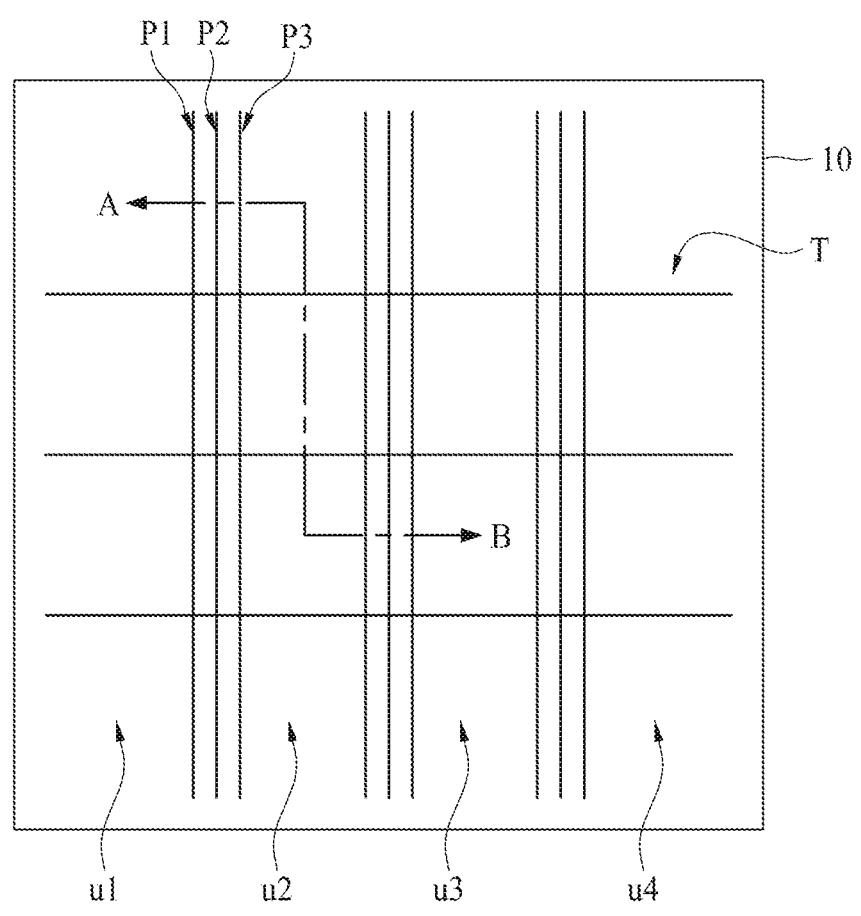
FIG. 1A is a schematic plan view of a related art see-through thin film type solar cell.
Figure 1B:
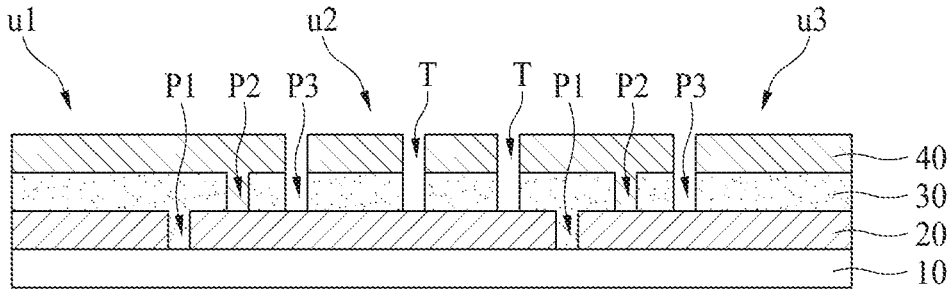
FIG. 1B is a cross-sectional view taken along line A-B of FIG. 1A.

Advantages and features of the present inventive concept, and implementation methods thereof will be clarified through following embodiments described with reference to the accompanying drawings. The present inventive concept may, however, be embodied in different forms and should not be construed as limited to the embodiments set forth herein. Rather, these embodiments are provided so that this disclosure will be thorough and complete, and will fully convey the scope of the present inventive concept to those skilled in the art. Further, the present inventive concept is only defined by scopes of claims.

A shape, a size, a ratio, an angle, and a number disclosed in the drawings for describing embodiments of the present inventive concept are merely an example, and thus, the present inventive concept is not limited to the illustrated details. Like reference numerals refer to like elements throughout. In the following description, when the detailed description of the relevant known function or configuration is determined to unnecessarily obscure the important point of the present inventive concept, the detailed description will be omitted. In a case where 'comprise', 'have', and 'include' described in the present specification are used, another part may be added unless 'only-' is used. The terms of a singular form may include plural forms unless referred to the contrary.

In construing an element, the element is construed as including an error range although there is no explicit description.

In describing a position relationship, for example, when a position relation between two parts is described as 'on-', 'over-', 'under-', and 'next-', one or more other parts may be disposed between the two parts unless 'just' or 'direct' is used.

In describing a time relationship, for example, when the temporal order is described as 'after-', 'subsequent-', 'next-', and 'before-', a case which is not continuous may be included unless 'just' or 'direct' is used.

It will be understood that, although the terms "first", "second", etc. may be used herein to describe various elements, these elements should not be limited by these terms. These terms are only used to distinguish one element from another. For example, a first element could be termed a second element, and, similarly, a second element could be termed a first element, without departing from the scope of the present inventive concept.

Features of various embodiments of the present inventive concept may be partially or overall coupled to or combined with each other, and may be variously inter-operated with each other and driven technically as those skilled in the art can sufficiently understand. The embodiments of the present inventive concept may be carried out independently from each other, or may be carried out together in co-dependent relationship.

Hereinafter, exemplary embodiments of the present inventive concept will be described in detail with reference to the accompanying drawings.

Figure 2A:
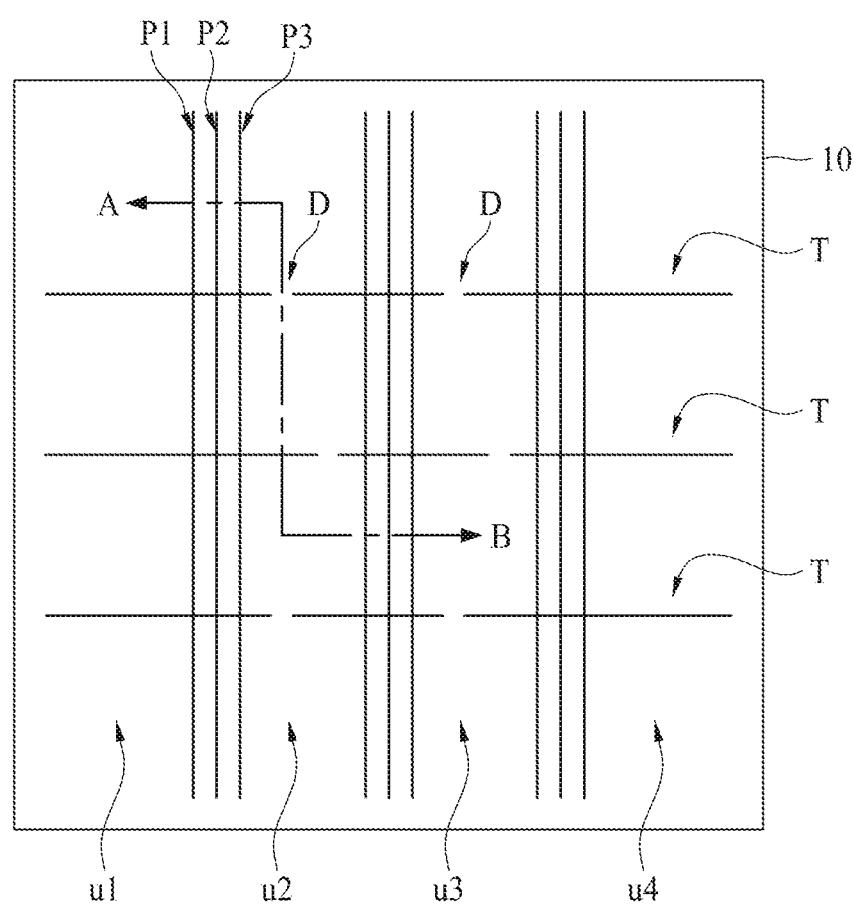
FIG. 2A is a schematic plan view of a see-through thin film type solar cell according to an embodiment of the present inventive concept.
Figure 2B:
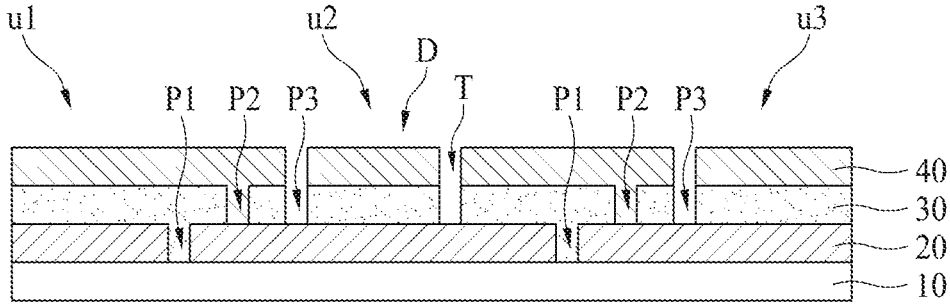
FIG. 2B is a cross-sectional view taken along line A-B of FIG. 2A.

FIG. 2A is a schematic plan view of a see-through thin film type solar cell according to an embodiment of the present inventive concept, and FIG. 2B is a cross-sectional view taken along line A-B of FIG. 2A.

As seen in FIG. 2A, a plurality of unit cells U1 to U4 including a first unit cell U1, a second unit cell U2, a third unit cell U3, and a fourth unit cell U4 are provided on a substrate 10.

The plurality of unit cells U1 to U4 are divided by a set of a first separation part P1, a contact part P2, and a second separation part P3. That is, a set of the first separation part P1, the contact part P2, and the second separation part P3 is each provided between the first unit cell U1 and the second unit cell U2, between the second unit cell U2 and the third unit cell U3, and between the third unit cell U3 and the fourth unit cell U4.

The plurality of unit cells U1 to U4 are serially connected to one another by a set of the first separation part P1, the contact part P2, and the second separation part P3.

The first separation part P1, the contact part P2, and the second separation part P3 are arranged in the same direction (for example, a lengthwise direction). Also, a plurality of light transmission parts T are arranged in a direction (for example, a widthwise direction) intersecting with the first separation part P1, the contact part P2, and the second separation part P3.

The plurality of light transmission parts T are apart from one another by a certain interval in a lengthwise direction. Light may pass through the light transmission part T, and thus, the thin film type solar cell according to an embodiment of the present inventive concept has a see-through type.

The light transmission part T intersects with the first separation part P1, the contact part P2, and the second separation part P3 and is provided in a discontinuous rectilinear structure without being provided in a continuous rectilinear structure. That is, a disconnection part D is provided in a certain area of a virtual rectilinear line on which the light transmission part T is arranged.

In the present specification, the light transmission part T being provided in the discontinuous rectilinear structure denotes that, since the disconnection part D is included in a rectilinear structure, the continuity of the rectilinear structure is not provided by the disconnection part D and a plurality of straight lines are arranged apart from one another with the disconnection part D therebetween, and when the plurality of straight lines apart from one another are connected, one continuous straight line is provided.

A discontinuous rectilinear structure configuring the light transmission part T may include one or two or more the disconnection parts D.

As described above, according to an embodiment of the present inventive concept, since the light transmission part T is provided the discontinuous rectilinear structure without being provided in the continuous rectilinear structure, a wave pattern such as a moire phenomenon may not be formed when light is passing through the light transmission part T, and thus, the visibility of the thin film type solar cell may be enhanced.

The inventor has checked that, when the light transmission part T is provided in the continuous rectilinear structure, a fine dot pattern configuring the light transmission part T is continuously provided, a wave pattern such as the moire phenomenon occurs when light is passing through the continuous dot pattern, and thus, when the continuous dot pattern is changed to a discontinuous dot pattern, a wave pattern such as the moire phenomenon does not occur because light passes through the discontinuous dot pattern. Accordingly, the inventor has completed the present inventive concept.

As seen in FIG. 2B, a plurality of first electrodes 200 are provided on a substrate 100, a plurality of semiconductor layers 300 are provided on the plurality of first electrodes 200, and a plurality of second electrodes 400 are provided on the plurality of semiconductor layers 300.

The substrate 100 may use glass or plastic.

The first electrode 200 may be formed of a transparent conductive material such as ZnO, ZnO:B, ZnO:Al, $SnO_2$, $SnO_2$:F, or indium tin oxide (ITO). The first electrode 200 may function as a front electrode of the thin film type solar cell, and thus, sunlight may be incident on the inside through the first electrode 200 formed of the transparent conductive material. In this case, a concave-convex structure may be provided on a surface of the first electrode 200 so that incident sunlight is maximally absorbed into the solar cell.

The first electrode 200 may be patterned in each of the unit cells U1 to U4. In detail, the plurality of first electrodes 200 are apart from one another with the first separation part P1 therebetween. The first separation part P1 may be formed by removing, through a laser scribing process, a certain area of an electrode layer for forming the first electrode 200.

The semiconductor layer 300 may be formed of a silicon-based semiconductor material (for example, amorphous silicon (a-Si:H) or micro crystalline silicon (μ c-Si:H)). The semiconductor layer 300 may be formed in a PIN structure where a positive (P)-type semiconductor layer, an intrinsic (I)-type semiconductor layer, and a negative (N)-type semiconductor layer are sequentially stacked. As described above, when the semiconductor layer 300 is formed in the PIN structure, the I-type semiconductor layer is depleted by the P-type semiconductor layer and the N-type semiconductor layer, and thus, an electric field is generated therein and a hole and an electron each generated from sunlight are drifted by the electric field and are collected by the P-type semiconductor layer and the N-type semiconductor layer.

When the semiconductor layer 300 is formed in the PIN structure, it is preferable that the P-type semiconductor layer is provided at a positon close to a portion on which sunlight is incident, and then, the I-type semiconductor layer and the N-type semiconductor layer are formed. The reason is for that, since the drift mobility of a hole is lower than that of an electron generally, the P-type semiconductor layer is formed close to a light receiving surface so as to maximize carrier collection efficiency based on incident light.

The semiconductor layer 300 is patterned in each of the unit cells U1 to U4. In detail, the plurality of semiconductor layer 300 are apart from one another with the contact part P2 and the second separation part P3 therebetween. The contact part P2 may be formed by removing, through a laser scribing process, a certain area of a semiconductor material layer for forming the semiconductor layer 300.

The second separation part P3 may be formed by removing, through a laser scribing process, a certain area of each of the semiconductor material layer for forming the semiconductor layer 300 and an electrode layer for forming the second electrode 400.

The second electrode 400 may be formed of a metal material such as Ag, Al, Ag+Mo, Ag+Ni, or Ag+Cu, but is not limited thereto and may be formed of a transparent conductive material such as ZnO, ZnO:B, ZnO:Al, SnO₂, SnO₂:F, or indium tin oxide (ITO). The second electrode 400 may function as a rear electrode corresponding to a surface opposite to a surface on which sunlight is incident, and in this case, the second electrode 400 may be formed of an opaque conductive material. However, the present inventive concept is not limited thereto, and the second electrode 400 may be formed of a transparent conductive material, whereby a transparent thin film type solar cell may be implemented.

The second electrode 400 is patterned in each of the unit cells U1 to U4. In detail, the plurality of second electrodes 400 are apart from one another with the second separation part P3 therebetween. Particularly, the second electrode 400 is electrically connected to the first electrode 200 through the contact part P2. In detail, the second electrode 400 of one unit cell U1 or U2 is connected to the first electrode 200 of the unit cell U2 or U3 adjacent thereto through the contact part P2, between adjacent unit cells U1 to U3, and thus, the plurality of unit cells U1 to U3 may be connected to one another in series.

In this case, the light transmission part T is provided in each of the unit cells U1 to U3. The light transmission part T is formed by removing, through a laser scribing process, a certain area of each of the semiconductor layer 300 and the second electrode 400. Therefore, external light may pass through the light transmission part T. The substrate 100 and the first electrode 200 are also formed in the light transmission part T area, but since the substrate 100 and the first electrode 200 are formed of a transparent material, light may pass through the light transmission part T area.

In the disconnection part D area described above, unlike the light transmission part T, a certain area of each of the semiconductor layer 300 and the second electrode 400 remains as-is without being removed. Therefore, the disconnection part D may not be an area through which light may pass like the light transmission part T. In detail, when the second electrode 200 is formed of an opaque material, the disconnection part D is an area through which light may not pass, and when the second electrode 200 is formed of a transparent material, the disconnection part D may transmit light but is lower in light transmission efficiency than the light transmission part T because a high amount of light is absorbed in the middle of passing through the semiconductor layer 300.

Hereinafter, a structure of a light transmission part T according to various embodiments of the present inventive concept will be described in more detail.

Figure 3:
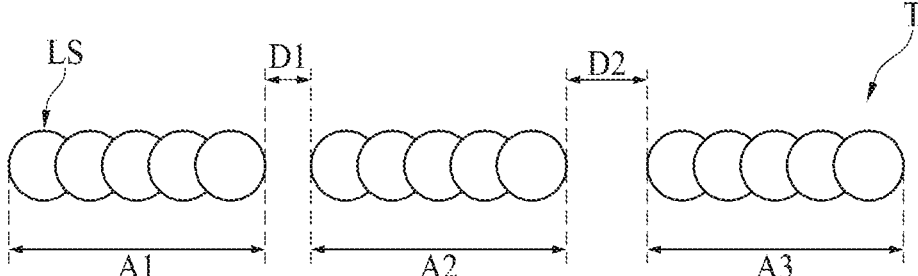
FIG. 3 illustrates a light transmission part T according to an embodiment of the present inventive concept.

FIG. 3 illustrates a light transmission part T according to an embodiment of the present inventive concept.

As seen in FIG. 3, the light transmission part T is formed through a laser scribing process, and thus, includes a plurality of laser spots LS.

The laser spot LS includes a dot pattern. The dot pattern has a shape determined based on a shape of the laser spot LS, and as illustrated, may be provided in a circular shape but is not limited thereto.

As described above, the plurality of laser spots LS each including the dot pattern are arranged to overlap one another, and thus, continuous areas A1 to A3 each including the light transmission part T are provided. The continuous areas A1 to A3 may each include a first electrode 200 provided on a substrate 100 by removing a semiconductor layer 300 and a second electrode 400 as in FIG. 2B described above.

The continuous areas A1 to A3, as illustrated, includes a first continuous area A1, a second continuous area A2, and a third continuous area A3, in which a plurality of dot patterns are arranged to overlap one another. A laser may rectilinearly move in forming the light transmission part T, and thus, the first continuous area A1, the second continuous area A2, and the third continuous area A3 may be arranged on a virtual straight line. However, the present inventive concept is not limited thereto. In this case, the number of laser spots LS or dot patterns may be the same in the continuous areas A1 to A3.

Disconnection parts D1 and D2 are provided between the continuous areas A1 to A3. That is, a first disconnection part D1 is provided between the first continuous area A1 and the second continuous area A2, and a second disconnection part D2 is provided between the second continuous area A2 and the third continuous area A3. The disconnection parts D1 and D2, as in FIG. 2B described above, may each include a first electrode 200, a semiconductor layer 300, and a second electrode 400 each provided on the substrate 100. In this case, a length of the first disconnection part D1 is set to be different from that of the second disconnection part D2.

According to a structure of FIG. 3, since the light transmission part T is discontinuously provided and a length of the first disconnection part D1 is set to be different from that of the second disconnection part D2, the repetition characteristic of the light transmission part T including the plurality of dot patterns may be more reduced. Accordingly, a problem where a wave pattern such as the moire phenomenon occurs when light is passing through the light transmission part T may be effectively solved.

Figure 4:
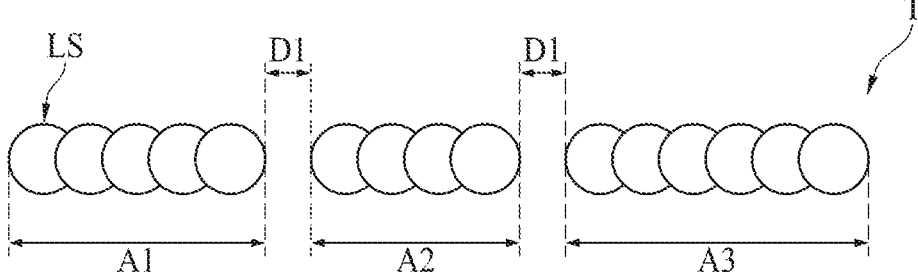
FIG. 4 illustrates a light transmission part T according to another embodiment of the present inventive concept.

FIG. 4 illustrates a light transmission part T according to another embodiment of the present inventive concept. The same elements as the embodiment of FIG. 3 are referred to by like elements, and repetitive descriptions of the same elements are omitted.

As seen in FIG. 4, a light transmission part T is provided in continuous areas A1 to A3 which are apart from one another with disconnection parts D1 to D3 therebetween.

In detail, a first continuous area A1 and a second continuous area A2 are apart from each other with a first disconnection part D1 therebetween, and the second continuous area A2 and a third continuous area A3 are apart from each other with a second disconnection part D2 therebetween.

In this case, the number of laser spots LS or dot patterns in the first continuous areas A1 differs from the number of laser spots LS or dot patterns in the second continuous areas A2. Also, the number of laser spots LS or dot patterns in the second continuous areas A2 differs from the number of laser spots LS or dot patterns in the third continuous areas A3. Also, the number of laser spots LS or dot patterns in the first continuous areas A1 differs from the number of laser spots LS or dot patterns in the third continuous areas A3.

As described above, the number of laser spots LS or dot patterns in the first continuous areas A1, the number of laser spots LS or dot patterns in the second continuous areas A2, and the number of laser spots LS or dot patterns in the third continuous areas A3 may be set differently.

However, the present inventive concept is not limited thereto, in the number of laser spots LS or dot patterns in the first continuous areas A1, the number of laser spots LS or dot patterns in the second continuous areas A2, and the number of laser spots LS or dot patterns in the third continuous areas A3, the number of laser spots LS or dot patterns may be differently set in only two of the continuous areas A1 to A3. For example, the number of laser spots LS or dot patterns in the first continuous areas A1 may differ from the number of laser spots LS or dot patterns in the second continuous areas A2, and the number of laser spots LS or dot patterns in the third continuous areas A3 may be the same as the number of laser spots LS or dot patterns in the first continuous areas A1 or the second continuous areas A2.

A length of the first disconnection part D1 may be set to be equal to that of the second disconnection part D2, but is not limited thereto and may be set to be different from that of the second disconnection part D2.

According to a structure of FIG. 4, since the light transmission part T is discontinuously provided and the number of laser spots LS or dot patterns is set differently in at least two continuous areas among the first continuous areas A1, the second continuous areas A2, and the third continuous areas A3, the repetition characteristic of the light transmission part T including the plurality of dot patterns may be more reduced. Accordingly, a problem where a wave pattern such as the moire phenomenon occurs when light is passing through the light transmission part T may be effectively solved.

Figure 5:
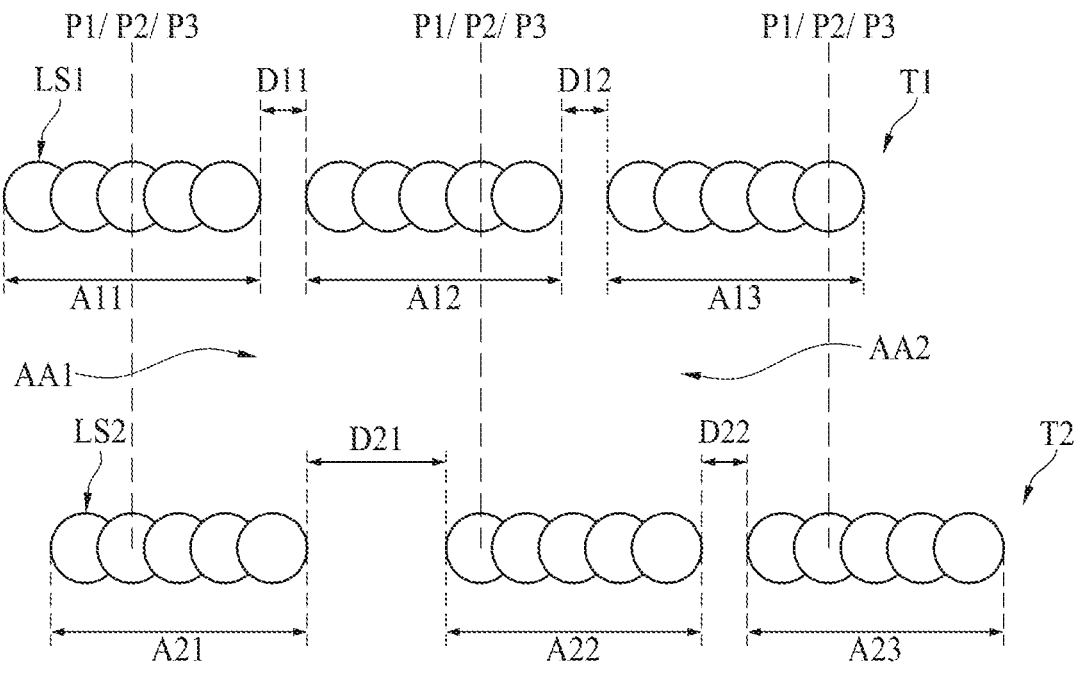
FIG. 5 illustrates a light transmission part T according to another embodiment of the present inventive concept.

FIG. 5 illustrates a light transmission part T according to another embodiment of the present inventive concept.

As seen in FIG. 5, a plurality of light transmission parts T1 and T2 are arranged to intersect with a plurality of first separation parts P1, contact parts P2, and second separation parts P3. Hereinafter, in the present specification, for convenience, a set of the first separation part P1, the contact part P2, and the second separation part P3 for dividing and serially connecting unit cells is referred to as a separation part.

Active areas AA1 and AA2 may be defined by three separation parts adjacent to and apart from one another and two light transmission parts T1 and T2 which intersect with the three separation parts and are apart from each other. That is, a first active area AA1 may be defined by a left separation part, a center separation part, a first light transmission part T1, and a second light transmission part T2, and a second active area AA2 may be defined by the center separation part, a right separation part, the first light transmission part T1, and the second light transmission part T2.

The first light transmission part T1 is provided in continuous areas A11 to A13 including a plurality of first laser spots LS1 including a plurality of dot patterns, and disconnection parts D11 and D12 are provided between the continuous areas A11 to A13. In detail, a first disconnection part D11 is provided between a first continuous area A11 and a second continuous area A12, and a second disconnection part D12 is provided between the second continuous area A12 and a third continuous area A13. The number of first laser spots LS1 or dot patterns may be the same in the first continuous area A11, the second continuous area A12, and the third continuous area A13, but is not limited thereto and may differ. Also, a length of the first disconnection part D11 may be the same as that of the second disconnection part D12, but is not limited thereto and may differ from that of the second disconnection part D12.

The second light transmission part T2 is provided in continuous areas A21 to A23 including a plurality of second laser spots LS2 including a plurality of dot patterns, and disconnection parts D21 and D22 are provided between the continuous areas A21 to A23. In detail, a first disconnection part D21 is provided between a first continuous area A21 and a second continuous area A22, and a second disconnection part D22 is provided between the second continuous area A22 and a third continuous area A23. The number of second laser spots LS2 or dot patterns may be the same in the first continuous area A21, the second continuous area A22, and the third continuous area A23, but is not limited thereto and may differ. Also, a length of the first disconnection part D21 may be the same as that of the second disconnection part D22, but is not limited thereto and may differ from that of the second disconnection part D22.

A pattern of the first light transmission part T1 is formed to be different from that of the second light transmission part T2. In detail, comparing with the continuous areas A11 to A13 including the first light transmission part T1, the continuous areas A21 to A23 including the second light transmission part T2 are shifted to one side (for example, a right side). Therefore, the first disconnection part D11 provided between the first and second continuous areas A11 and A12 including the first light transmission part T1 does not overlap the first disconnection part D21 provided between the first and second continuous areas A21 and A22 including the second light transmission part T2, and the second disconnection part D12 provided between the second and third continuous areas A12 and A13 including the first light transmission part T1 does not overlap the second disconnection part D22 provided between the second and third continuous areas A22 and A23 including the second light transmission part T2.

In the present specification, that the first/second disconnection part D11/D12 of the first light transmission part T1 does not overlap the first/second disconnection part D21/D22 of the second light transmission part T2 denotes that the first/second disconnection part D11/D12 of the first light transmission part T1 does not overlap the first/second disconnection part D21/D22 of the second light transmission part T2 in a direction (for example, a lengthwise direction) vertical to an arrangement direction (for example, a widthwise direction) of the first continuous areas A11 to A13 or the second continuous areas A21 to A23.

On the other hand, the first disconnection part D11 provided between the first and second continuous areas A11 and A12 including the first light transmission part T1 overlaps the first continuous area A21 including the second light transmission part T2, and the second disconnection part D12 provided between the second and third continuous areas A12 and A13 including the first light transmission part T1 overlaps the second continuous area A22 including the second light transmission part T2.

Moreover, the first disconnection part D21 provided between the first and second continuous areas A21 and A22 including the second light transmission part T2 overlaps the second continuous area A12 including the first light transmission part T1, and the second disconnection part D22 provided between the second and third continuous areas A22 and A23 including the second light transmission part T2 overlaps the third continuous area A13 including the first light transmission part T1.

Based on such a configuration, at least one of the disconnection parts D11, D12 D21, and D22 is provided at a boundary between the first active area AA1 and the second active area AA2. That is, the first disconnection part D11 of the first light transmission part T1 and the first disconnection part D21 of the second light transmission part T2 are provided at a boundary of the first active area AA1, and the second disconnection part D12 of the first light transmission part T1 and the second disconnection part D22 of the second light transmission part T2 are provided at a boundary of the second active area AA2. In this case, the first disconnection parts D11 and D12 provided at the boundary of the first active area AA1 and the second disconnection parts D12 and D22 provided at the boundary of the second active area AA2 do not overlap one another, and thus, are provided asymmetrically.

In the present specification, the disconnection parts D11, D12, D21, and D22 of the light transmission parts T1 and T2 denote the disconnection parts D11, D12, D21, and D22 provided between the continuous areas A11, A12, A13, A21, A22, and A23 including the light transmission parts T1 and T2.

According to a structure of FIG. 5, since the light transmission parts T1 and T2 are discontinuously provided and the disconnection parts D11 and D12 of the first light transmission part T1 and the disconnection parts D21 and D22 of the second light transmission part T2 are provided not to overlap one another, the repetition characteristic of the light transmission part T including the plurality of dot patterns may be more reduced. Accordingly, a problem where a wave pattern such as the moire phenomenon occurs when light is passing through the light transmission part T may be effectively solved.

Figure 6:
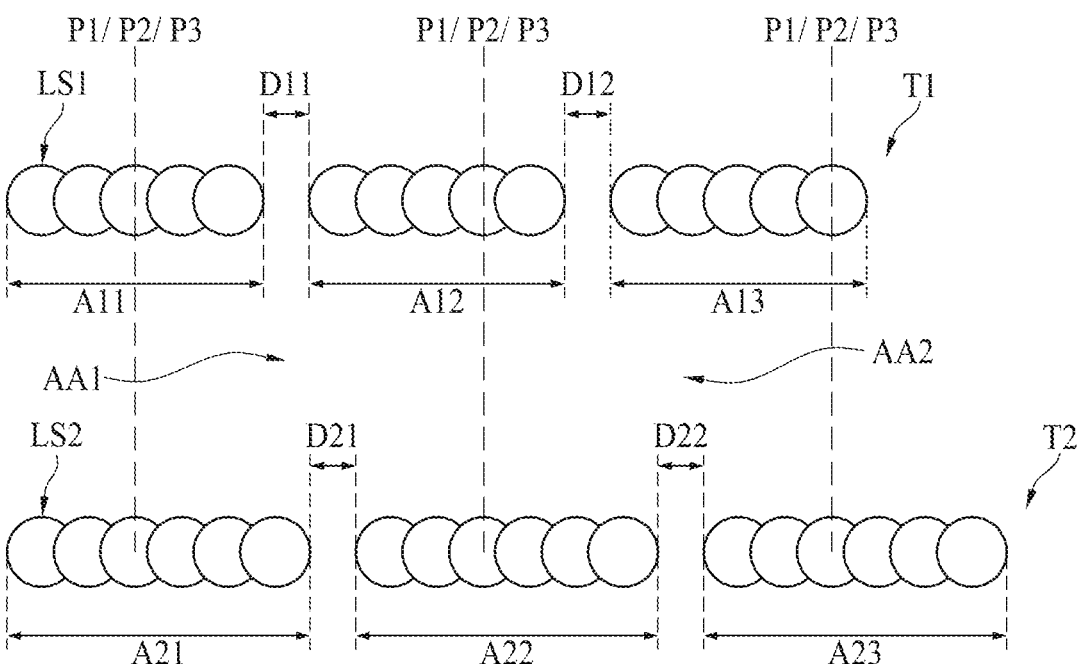
FIG. 6 illustrates a light transmission part T according to another embodiment of the present inventive concept.

FIG. 6 illustrates a light transmission part T according to another embodiment of the present inventive concept. The same elements as the embodiment of FIG. 5 are referred to by like elements, and repetitive descriptions of the same elements are omitted.

As seen in FIG. 6, a first light transmission part T1 and a second light transmission part T2 are arranged apart from each other to intersect with a plurality of separation parts, and thus, a first active area AA1 and a second active area AA2 are defined.

The first light transmission part T1 is provided in first to third continuous areas A11 to A13, and first and second disconnection parts D11 and D12 are provided between the first to third continuous areas A11 to A13.

The second light transmission part T2 is provided in first to third continuous areas A21 to A23, and first and second disconnection parts D21 and D22 are provided between the first to third continuous areas A21 to A23.

In this case, the number of first laser spots LS1 or dot patterns in the first to third continuous areas A11 to A13 including the first light transmission part T1 differs from the number of second laser spots LS2 or dot patterns in the first to third continuous areas A21 to A23 including the second light transmission part T2.

The number of first laser spots LS1 or dot patterns may be the same in the first to third continuous areas A11 to A13 including the first light transmission part T1, but is not limited thereto. Also, the number of second laser spots LS2 or dot patterns may be the same in the first to third continuous areas A21 to A23 including the second light transmission part T2, but is not limited thereto.

A length of each of the disconnection parts D11 and D12 of the first light transmission part T1 may be the same as that of each of the disconnection parts D21 and D22 of the second light transmission part T2, but is not limited thereto.

A length of the first disconnection part D11 of the first light transmission part T1 may be the same as that of the second disconnection part D12, but is not limited thereto. Also, a length of the first disconnection part D21 of the second light transmission part T2 may be the same as that of the second disconnection part D22, but is not limited thereto.

According to a structure of FIG. 6, since the light transmission parts T1 and T2 are discontinuously provided, the disconnection parts D11 and D12 of the first light transmission part T1 and the disconnection parts D21 and D22 of the second light transmission part T2 are provided not to overlap one another, and the number of first laser spots LS1 or dot patterns in the first to third continuous areas A11 to A13 including the first light transmission part T1 is set to be different from the number of second laser spots LS2 or dot patterns in the first to third continuous areas A21 to A23 including the second light transmission part T2, the repetition characteristic of the light transmission part T including the plurality of dot patterns may be more reduced. Accordingly, a problem where a wave pattern such as the moire phenomenon occurs when light is passing through the light transmission part T may be effectively solved.

Hereinabove, the embodiments of the present inventive concept have been described in more detail with reference to the accompanying drawings, but the present inventive concept is not limited to the embodiments and may be variously modified within a range which does not depart from the technical spirit of the present inventive concept. Therefore, it should be understood that the embodiments described above are exemplary from every aspect and are not restrictive. It should be construed that the scope of the present inventive concept is defined by the below-described claims instead of the detailed description, and the meanings and scope of the claims and all variations or modified forms inferred from their equivalent concepts are included in the scope of the present inventive concept.

We claim:

1. A thin film type solar cell comprising:

a plurality of unit cells serially connected to one another on a substrate, the plurality of unit cells including a plurality of front electrodes, a plurality of semiconductor layers on the plurality of front electrodes, and a plurality of rear electrodes on the plurality of semiconductor layers;

a light transmission part provided in the plurality of unit cells; and a plurality of separation parts including a first separation part, a second separation part and a third separation part, the plurality of separation parts arranged on the substrate to separate the plurality of unit cells and intersecting with the light transmission part, wherein the first separation part, the second separation part and the third separation part are provided between the plurality of front electrodes or between the plurality of rear electrodes, wherein the light transmission part is provided in a discontinuous rectilinear structure including at least one disconnection part, wherein the light transmission part comprises a first light transmission part and a second light transmission part which are apart from each other in a first direction and are parallel to each other, wherein the first light transmission part comprises a first continuous area, a second continuous area, a third continuous area, a first disconnection part between the first continuous area and the second continuous area, and a second disconnection part between the second continuous area and the third continuous area, and wherein the second light transmission part comprises a first continuous area, a second continuous area, a third continuous area, a first disconnection part between the first continuous area and the second continuous area, and a second disconnection part between the second continuous area and the third continuous area, wherein the first separation part, the second separation part and the third separation part are arranged in the first direction, and the first light transmission part and the second light transmission part are arranged in a second direction different from the first direction, wherein the first continuous area, the second continuous area, the third to sixth continuous area of the first light transmission part and the second light transmission parts intersect with any one of the first separation part, second separation part and to third separation parts while contacting any one of the first separation part, the second separation part and the third separation parts, and the first disconnection part and second disconnection part of each of the first light transmission part and the second light transmission part are separated from the first separation part, the second separation part and the third separation part by the one or more of the first continuous area, the second continuous area, and the third continuous area of the first light transmission part and the second light transmission part, wherein the first disconnection part of the first light transmission part and the first disconnection part of the second light transmission part are provided between the first separation part and the second separation part, and the second disconnection part of the first light transmission part and the second disconnection part of the second light transmission part are provided between the second separation part and the third separation part, wherein a plurality of dot patterns overlaps one another in the first continuous area, the second continuous area and the third continuous area of the first light transmission, and number of the plurality of dot patterns differs in at least two continuous areas among the first continuous area, the second continuous area, and the third continuous area, wherein the first separation part, the second separation part, the first light transmission part and the second light transmission part define a first active area, and the second separation part, the third separation part, the first light transmission part and the second light transmission part define a second active area adjacent to the first active area, and wherein the first disconnection part of each of the first light transmission part and the second light transmission part is provided at a boundary of the first active area, and the second disconnection part of each of the first light transmission part and second light transmission part is provided at a boundary of the second active area.

2. The thin film type solar cell of claim 1, wherein the number of the plurality of dot patterns in the first continuous area, the number of the plurality of dot patterns in the second continuous area, and the number of the plurality of dot patterns in the third continuous area of each of the first light transmission part and the second light transmission part are different from one another.

3. The thin film type solar cell of claim 1, wherein a pattern of the first light transmission part differs from a pattern of the second light transmission part.

4. The thin film type solar cell of claim 1, wherein the first continuous area, the second continuous area, the third continuous area, the first disconnection part and the second disconnection part of each of the first light transmission part and the second light transmission part, are provided in a straight line in a second direction, and the second direction is perpendicular to the first direction.

5. The thin film type solar cell of claim 1, wherein the first disconnection part and the second disconnection part of the second light transmission part are provided not to overlap the first disconnection part or the second disconnection part of the first light transmission part.

6. The thin film type solar cell of claim 1, wherein the first disconnection part of the first light transmission part and the second disconnection part of the second light transmission part are provided asymmetrically.

7. The thin film type solar cell of claim 1, wherein the plurality of front electrodes, the plurality of semiconductor layers, and the plurality of rear second electrodes are provided on the substrate, and each light transmission part is provided in a structure where a certain area of a respective semiconductor layer and second electrode are removed.

8. The thin film type solar cell of claim 1, wherein a length of the first disconnection part of each of the first light transmission part and the second light transmission part differs from a length of the second disconnection part of each of the first light transmission part and the second light transmission part.

* * * * *